(12) United States Patent
Belitzer et al.

(10) Patent No.: US 7,777,578 B2
(45) Date of Patent: Aug. 17, 2010

(54) OSCILLATOR CIRCUIT, IN PARTICULAR FOR MOBILE RADIO

(75) Inventors: Alexander Belitzer, München (DE); Stefan Herzinger, Sauerlach (DE); Giuseppe Li Puma, Bochum (DE)

(73) Assignee: Infineon Technologies AG, Munich (DE)

( * ) Notice: Subject to any disclaimer, the term of this patent is extended or adjusted under 35 U.S.C. 154(b) by 731 days.

(21) Appl. No.: 11/394,013

(22) Filed: Mar. 30, 2006

(65) Prior Publication Data

US 2006/0226918 A1    Oct. 12, 2006

Related U.S. Application Data

(63) Continuation of application No. PCT/DE2004/002180, filed on Sep. 30, 2004.

(30) Foreign Application Priority Data

Sep. 30, 2003  (DE) ................. 103 45 497

(51) Int. Cl.
*H03L 7/085* (2006.01)
(52) U.S. Cl. .............. 331/18; 331/16; 331/25
(58) Field of Classification Search ............ 331/16, 331/18, 25
See application file for complete search history.

(56) References Cited

U.S. PATENT DOCUMENTS

| | | | | |
|---|---|---|---|---|
| 5,742,208 A | * | 4/1998 | Blazo | ............ 331/23 |
| 6,259,328 B1 | * | 7/2001 | Wesolowski | ............ 331/14 |
| 6,326,851 B1 | * | 12/2001 | Staszewski et al. | ............ 331/17 |
| 6,429,693 B1 | * | 8/2002 | Staszewski et al. | ............ 327/12 |
| 6,606,004 B2 | | 8/2003 | Staszewski et al. | |
| 7,242,912 B2 | * | 7/2007 | Maligeorgos et al. | ......... 455/88 |

FOREIGN PATENT DOCUMENTS

| | | |
|---|---|---|
| DE | 195 46 928 A1 | 6/1997 |
| EP | 1 143 606 A1 | 10/2001 |
| EP | 1 330 034 A2 | 7/2003 |

\* cited by examiner

*Primary Examiner*—Robert Pascal
*Assistant Examiner*—Levi Gannon
(74) *Attorney, Agent, or Firm*—Eschweiler & Associates, LLC

(57) ABSTRACT

An oscillator is disclosed that is tunable to discrete values, and includes a tuning element which can be connected via a switching device. A rectifier circuit is connected to the output of the oscillator and forms a clock signal from the oscillator signal. The oscillator circuit contains a phase delay circuit having a switching input, a clock signal input which is coupled to the output of the rectifier circuit, and a switching output coupled to the switching device. The phase delay circuit has a comparison circuit for comparison of a phase of the clock signal that is applied to the signal input with a reference phase. This phase delay circuit is designed to emit a switching signal after application of an activation signal to the switching input and after the phase of the clock signal which is applied to the signal input matches the reference phase. In consequence, the switching process is delayed until the step-function response of the output signal of the oscillator does not cause a sudden phase change in the clock signal.

15 Claims, 3 Drawing Sheets

OSCILLATOR CIRCUIT, IN PARTICULAR FOR MOBILE RADIO

REFERENCE TO RELATED APPLICATIONS

This application is a continuation of PCT/DE2004/002180 filed Sep. 30, 2004 which was not published in English, that claims the benefit of the priority date of German Patent Application No. DE 103 45 497.7, filed on Sep. 30, 2003, the contents of which both are herein incorporated by reference in their entireties.

FIELD OF THE INVENTION

The invention relates to an oscillator circuit, for example, for a mobile radio.

BACKGROUND OF THE INVENTION

Tunable-frequency oscillators are used for widely different purposes. Inter alia, they provide the clock signal for digital circuits in mobile radio devices. The output frequency of the oscillator varies because of external influences, such as temperature changes. It is thus necessary to retune the oscillator again, and to change the output frequency.

In the case of voltage controlled oscillators (VCOs), this is achieved by application of a continuous voltage to a capacitance which is coupled to the resonant circuit of the oscillator. The capacitance in this case determines the resonant frequency of the oscillator. Variation of the capacitance thus also results in the output frequency being changed, because of the voltage change.

In contrast to this, in the case of a digitally controlled oscillator (DCO), discrete-value capacitances are added to or disconnected from the resonant circuit of the oscillator. The variation of the capacitance in steps thus produces a frequency change in the form of individual sudden changes at the output of the digitally tunable oscillator. This discrete-value frequency change results in a sudden phase change in the output frequency.

In modern communication systems, the various circuits use the same reference frequency and the same reference oscillator. For example, in a mobile radio, the GSM system part as well as the Bluetooth transceiver use the clock signal from the same digitally tunable oscillator. The GSM system is very sensitive to fluctuations in the frequency, and now produces a control signal in order to set a new clock frequency for the digitally tunable oscillator. This results in a sudden phase change being produced in the output signal from the oscillator, which is also evident in the clock signal. If the Bluetooth transceiver is in a receiver mode at the same time, the transceiver may possibly lose received data as a result of the sudden phase change in the clock signal, or may receive this only incorrectly.

Since, in general, all digital and analog circuits react sensitively to phase changes in the clock signal, it is desirable to minimize the sudden phase change. The voltage controlled oscillators therefore use low-pass filters which filter the programmed voltage change and thus produce only a very slow and small phase change. The disadvantage of this filter method is, however, the long time period which is required for a frequency change. In consequence, the current drawn is also increased and the life, in particular of mobile radios, falls. In the case of a digitally tunable oscillator in which a frequency change is carried out by means of a discrete sudden change in the capacitance, such filtering is also possible, but the discrete sudden change in the capacitance cannot be completely avoided.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention is directed to an oscillator control circuit in which any sudden phase change when a frequency change occurs is reduced. The invention also comprises a method for changing a frequency in an oscillator control circuit, in which any sudden change in the output signal of the control circuit is reduced.

In one embodiment of the invention, an oscillator control circuit comprises an oscillator which can be tuned to discrete values, having an output for production of an oscillator signal. The tunable oscillator contains at least one tuning element which is connected selectively via a switching device for tuning the frequency of the oscillator signal. The output of the tunable oscillator is connected to a rectifier circuit, which is designed to produce a clock signal, which is formed from the oscillator, at an output. The clock signal which is formed from the oscillator is in this example a square-wave clock signal. The oscillator control circuit has a phase delay circuit, which has a first switching input as well as a signal input which is coupled to the output of the rectifier circuit. A switching output of the phase delay circuit is coupled to the switching device of the oscillator. The phase delay circuit is designed to emit a switching signal at the switching output after application of an activation signal to the first switching input of the phase delay circuit, and after subsequently reaching a specific phase of the clock signal.

A sudden phase change in the clock signal which is formed by the rectifier circuit occurs in particular when the tuning element of the oscillator, which can be tuned to discrete values, is switched at a time at which the amplitude of the oscillator signal reaches the threshold value of the rectifier. According to the invention, the phase delay circuit is used to ensure that the switching process of the tuning element is carried out at a time at which the output signal is considerably different from the threshold value, so that the output signal from the rectifier circuit now has a reduced or negligibly small sudden phase change during the step-function response of the oscillator circuit, because of the connected tuning element.

According to one embodiment of the invention, this is achieved by the phase delay circuit, which delays the transmission of the switching signal for the frequency change by a specific phase amount. In one example, the phase delay circuit waits with the delay until the clock signal has a specific phase, for example a rising or a falling edge. Delaying the switching process until a suitable time thus reduces a sudden phase change in the output signal. The step-function response of the oscillator signal therefore does not affect substantially the phase of the derived clock signal.

In one embodiment of the invention, the phase delay circuit comprises a comparison circuit configured to compare a phase of the clock signal that is applied to the signal input with a first phase. The comparison circuit is configured in one example to detect the rising or falling edge of the clock signal, with the edges of the clock signal being associated with the first phase. The comparison circuit then emits a signal, which is delayed by the selected phase delay.

In another embodiment, the phase delay circuit comprises a comparison circuit for comparison of a phase of the clock signal that is applied to the signal input with a reference phase. The phase delay circuit is configured to emit a switching signal at the switching output after the application of an activation signal to the first switching input of the phase delay circuit and after the phase of the signal which is applied to the signal input matches the reference phase.

In this embodiment, it is advantageous for the comparison circuit in the phase delay circuit to emit the switching signal of the switching output of the phase delay circuit when the phase of the clock signal which is applied to the signal input matches the reference phase. In this example, the comparison circuit in the phase delay circuit emits the switching signal for the switching device of the tunable oscillator, which then connects or disconnects the tuning element.

In one embodiment of the invention, the phase delay circuit has a first and a second operating state. In the first operating state, it is configured for phase-defined synchronization of the switching signal to the clock signal. The second operating state represents a waiting state, in which the phase synchronization circuit does not emit any signal. The comparison circuit can advantageously be switched from the second operating state to the first operating state by the activation signal at the first switching input. It is thus activated when a signal for switching the oscillator frequency is applied. The comparison circuit may switch back to the second operating state after the comparison or the emission of the switching signal.

In another embodiment of the invention, the phase delay circuit has a second switching input configured to supply a program signal. The second switching input is coupled to a means for adjustment of the phase delay of the comparison circuit. The phase delay is thus variable in this example. This is particularly advantageous when external operating parameters have changed, so that sufficient reduction in the sudden phase change in the clock output signal with the previous phase delay is no longer sufficient.

In one embodiment of the invention, the means for adjustment comprises a programmable storage device, in which at least two reference phases, which can be selected by the program signal, are stored. Different reference phases can thus be stored in the storage device, and can be selected by the program signal as required. This is advantageous when the phase delay circuit is a programmable phase delay circuit with fixed phase values. The program signal thus selects the reference phase for which the sudden phase change in the clock signal is a minimum. Alternatively, the programmable storage device contains at least two phase delays which can be selected by the program signal.

In another embodiment of the invention, the phase delay circuit is configured to emit a switching signal, which is dependent on the switching signal at the first switching input, at the switching output. This is advantageous when the tunable oscillator has a plurality of tuning elements. The switching signal at the switching input of the phase delay circuit contains the information which the tuning elements require for the frequency change. The phase delay circuit thus switches the correct tuning element, delayed by its switching signal at the switching output.

It is advantageous for the at least one tuning element of the oscillator to comprise a charge store. Alternatively, the at least one tuning element of the oscillator comprises a varactor diode. In another alternative, the at least one tuning element of the oscillator comprises a capacitor. The resonant frequency of the oscillator which can be tuned to discrete values is thus changed by means of a capacitance change. Fixed capacitance values are, for example, added to or disconnected from the resonant circuit of the tunable oscillator via the switching device.

A method for carrying out a frequency change in an oscillator control circuit which has an oscillator which can be tuned to discrete values according to the invention comprises receiving an activation signal for frequency switching of the oscillator at a switching input of the oscillator control circuit. One phase of a clock signal derived from the oscillator signal is compared with a reference phase, and if the two phases match, a switching signal for frequency switching of the oscillator which can be tuned to discrete values is produced. The frequency of the oscillator is then switched by means of the switching signal.

The delay to the frequency switching of the oscillator which can be tuned to discrete values reduces any sudden phase change in the output signal.

The method is particularly suitable for the circuit according to the invention. In this case, any sudden phase change in a clock signal of an oscillator circuit during frequency switching of the oscillator signal is reduced by supplying a signal for the frequency switching of the oscillator to the first switching input of the phase delay circuit. The phase delay circuit then compares the phase of the clock signal which is formed from the oscillator with a reference phase. If the two phases match, the switching signal is generated at the switching output of the phase delay circuit, and is supplied to the switching device for switching the tuning element of the oscillator.

In one embodiment of the method, when the phase matches the reference phase, a phase delay is additionally waited for, and then a switching signal is produced. It is worthwhile in such an example to carry out the comparison process in such a way that the rising or the falling edge with which in each case one phase is associated is detected.

The switching signal at the first switching input is used, in one example, to select the tuning element to be switched by the switching device of the oscillator. This is advantageous when the oscillator has a plurality of switchable tuning elements, or a digital tuning matrix. Furthermore, an additional program signal can be used to select the reference phase to be used for the comparison in the phase delay circuit. This makes it possible, for example, to compensate for temperature changes or component variations in production.

In one embodiment of the method, the oscillator frequency is switched by producing a reference signal by means of the selected phase delay, followed by the switching signal for frequency switching, in synchronism with the reference signal.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text with the assistance of the drawings, in which.

DETAILED DESCRIPTION OF THE INVENTION

Figure 1:
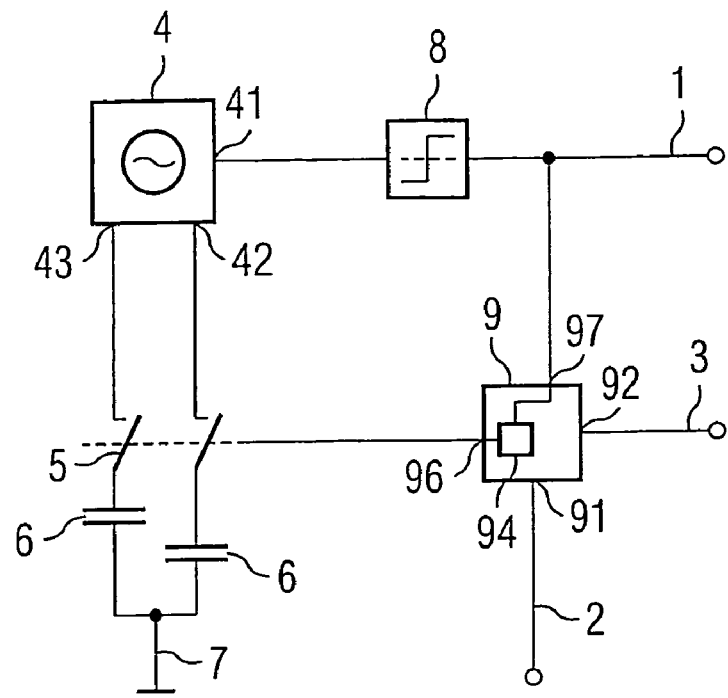
FIG. 1 is a schematic diagram illustrating one exemplary embodiment of the invention.

FIG. 1 shows an oscillator control circuit at whose output 1 a square-wave clock signal at a defined frequency can be tapped off. The oscillator control circuit has a first switching input 2 and a program signal input 3.

The oscillator control circuit contains an oscillator (DCO) which can be tuned digitally or can be tuned to discrete values, and which has an output for production of an oscillator signal. The frequency of the oscillator signal is determined by a resonant circuit. Furthermore, in this exemplary embodiment, the oscillator 4 has two inputs 42 and 43, which are connected via a switch 5 to in each case one connection of a capacitor 6. The respective other connection of the capacitor 6 leads to a reference ground potential 7. When the switch is closed, the capacitors are connected to the resonant circuit, which is not illustrated, and thus vary the frequency of the oscillator signal which has been produced at the output 41.

The output 41 of the oscillator 4 is connected to a rectifier circuit 8. The rectifier circuit 8 itself has an output which is connected to the output 1 of the oscillator control circuit. The rectifier circuit 8 uses the sinusoidal oscillator signal from the oscillator 4 to produce a square-wave clock signal, and emits this at the output. In this exemplary embodiment, it uses a threshold voltage for this purpose, which it compares with the input signal. If the input signal is greater than this threshold voltage, then a signal with a positive, and in places a constant, amplitude is produced at the output, while if the level of the oscillator signal at the input of the rectifier circuit 8 is less than the threshold value, then the rectifier circuit produces a signal with a negative amplitude.

The output of the rectifier 8 is connected to a clock signal input 97 of a phase delay circuit 9. The phase delay circuit 9 contains a switching input 91 as well as a program signal input 92. The switching input 91 is connected to the switching input 2 of the oscillator control circuit, while the program signal input 92 is connected to the program signal input 3. The phase delay circuit has a signal output 96 which is coupled to the switching device 5. Depending on the switching signal at the switching output of the phase delay circuit 9, the switching device 5 connects one of the two capacitors 6 to the inputs 42 and 43, and thus produces a frequency change in the digitally tunable oscillator 4. The phase delay circuit 9 itself is activated by an activation signal at the switching input 91. It then compares the phase of the clock signal at the output of the rectifier circuit 8 with a reference phase.

The phase of a signal can be represented as a rotating vector on a vector diagram. The rate at which the vector rotates is a measure of the frequency. A sudden phase change in the clock signal of the output 1 of the oscillator control circuit occurs whenever frequency switching of the oscillator 4 takes place close to a time at which the amplitude of the sinusoidal output signal from the oscillator reaches the threshold value of the rectifier circuit 8. The step-function response in the oscillator output signal which results from the frequency switching also produces a sudden phase change in the oscillator signal. This can lead to the threshold value being reached not just twice but more often during one time period. The clock output signal is thus also changed. According to the invention, the switching is carried out in such a way that the frequency switching takes place at a time which ensures that the step-function response which results from this does not cause any additional clock signal change.

The point at which the amplitude of the oscillator signal reaches the threshold value represents a reference time which in this exemplary embodiment is associated with the phase 0 degrees. This is advantageously at the same time of the rising edge of the clock signal. After half a time period, the threshold value is reached again, and this corresponds to a phase of 180 degrees. After one time period, the phase angle is 360 degrees, which is once again the 0 degrees of the start point.

The comparison circuit in the phase delay circuit 9 of the invention now compares the phase of the clock signal with the reference phase. When the rotating vector reaches the value of the reference phase, then the comparison circuit emits the switching signal to the switching output of the phase delay circuit, and the switching device 5 connects the capacitor 6 to the tunable oscillator. The sudden capacitance change produces a step-function response in the output signal of the oscillator 4. However, the step function response has already decayed by the time the amplitude of the output signal of the oscillator reaches the threshold value of the rectifier circuit. This avoids any sudden phase change at the output of the clock signal.

It is irrelevant for the comparison circuit in the phase delay circuit how quickly the phase vector of the clock signal rotates. Starting from the phase of 0 degrees, corresponding to the time of the amplitude zero crossing, the switching signal is delayed until the two phases match. This is dependent on the rotation rate of the phase vector and on the frequency of the clock signal. However, the reference phase is, in this example, set in such a way that the step-function response of the oscillator signal has already decayed in the event of another zero crossing by the threshold value to such an extent that no sudden phase change takes place in the rectified clock signal.

The rectifier circuit in this example has only one threshold voltage. By way of example, this can be implemented by means of a suitably designed comparator circuit. Other possible implementations are bistable multivibrator circuits such as a Schmitt trigger, although these have hysteresis or two threshold values. Suitably designed flipflop circuits can also be used as a rectifier circuit, and any such rectifying circuit or structure is contemplated as falling within the scope of the present invention.

Figure 3:
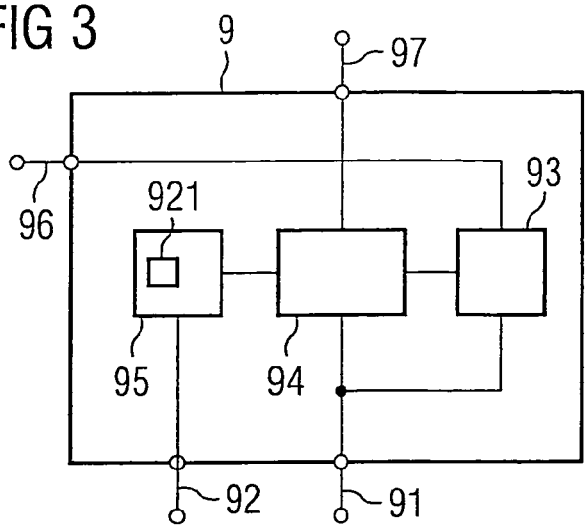
FIG. 3 is a block diagram illustrating a phase delay circuit according to an embodiment of the invention.

FIG. 3 shows one embodiment of the phase delay circuit 9, which contains a comparison circuit 94 which can be activated by a switching signal at the input 91, and which carries out a comparison between the phase of the signal which is applied to the clock signal input 97 and a reference phase. The reference phase is in this case freely variable. It is provided by a circuit 95 which is connected to the program input 92 for the program signal, and has a storage device 921. Various predetermined reference phases are stored in the storage device 921. Depending on the program signal at the program signal input 92, the circuit 95 selects one reference phase from the storage device 921, and sends this to the comparison device 94.

The phase delay circuit 9 also contains a circuit 93, one input of which is connected to the comparison circuit 94, while a second input of which is connected to the switching input 91.

The switching signal of the input 91 is a digital switching signal and, in addition to the request for a frequency change, also contains information as to what frequency change should be carried out. This results in a defined state as to which capacitance should be connected in the resonant circuit of the oscillator. The circuit 93 evaluates this information and uses it to produce a switching signal. The switching signal is emitted at the input 96 as soon as the comparison means 94 has itself emitted the start signal to the circuit 93.

In the embodiment shown in FIG. 3, the phase delay circuit is a programmable phase delay circuit. A plurality of reference phases are stored in the storage device 921. One of these reference phases is selected by the signal of the input 95, and is used for the comparison process. This is particularly advantageous when the reference phase to be selected is not known in advance but must be determined, for example, by a series of trials.

Figure 6:
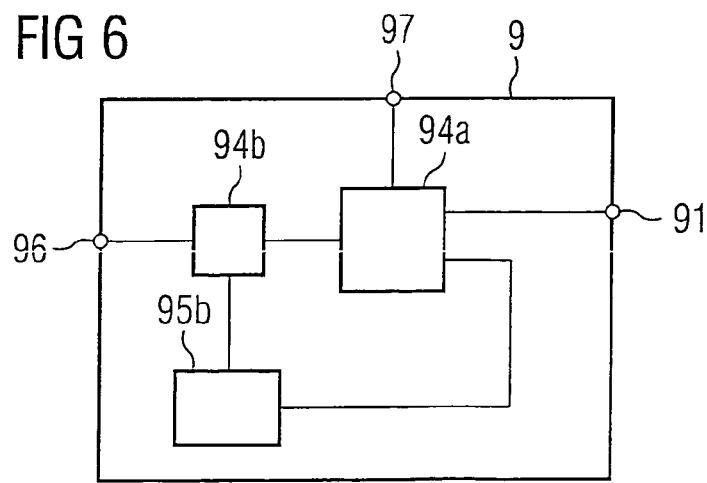
FIG. 6 is a block diagram illustrating a phase delay circuit according to another embodiment of the invention.

FIG. 6 shows another embodiment of the phase delay circuit according to the invention. In this case, the circuit contains an edge detector which detects the rising edge of the clock signal at the clock signal input 97. When a rising edge is detected in the clock signal, then the edge detector 94a produces a signal for the delay circuit 94b. This delays the signal by a specific phase, for example by pi/8. Various phase delays can be selected for the delay circuit 94b by means of the circuit 95b. For this purpose, the circuit 95b receives information about the instantaneous clock frequency from the edge detector 94a. This embodiment is more simple than that shown in FIG. 3, since only a single edge detector and one delay circuit are required. However, in the end, the edge detector is also a comparison circuit which detects on the phase associated with the edge.

Figure 4:
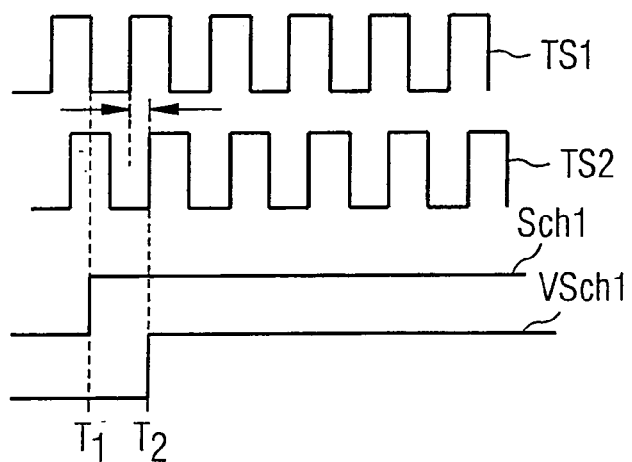
FIG. 4 is a timing diagram illustrating one exemplary aspect of the invention.

The timing diagram example illustration shown in FIG. 4 is applicable for all embodiments. The switching signal for frequency switching is sent to the phase delay circuit shown in FIG. 1, 3 or 6 at the time T1. At this time, the undelayed clock signal TS1 has a falling edge, and frequency switching would lead to a severe sudden phase change in the clock signal. The switching is thus delayed until a rising edge has been detected once again, and the phase has additionally reached a specific magnitude. This is equivalent to a specific time having passed. At the time T2, the switching signal for frequency switching is emitted from the phase delay circuit. The step-function response will have already decayed sufficiently again before the next falling edge.

The edge detector in the phase delay circuit shown in FIG. 6 detects the rising edge of the clock signal TS1, and passes on a signal to the delay circuit 94b. This produces a delay by the specific phase magnitude pi/8, which at the same time also corresponds to a delay time, although this is frequency-dependent. In contrast to this, the comparison circuit in FIG. 1 or 3 detects the phase of the clock signal TS1. In this case, by way of example, the rising edge of the clock signal corresponds to the phase 0°, and the falling edge to the phase 180°. The phase of the clock signal TS1 was accordingly just 180° at the time T1. The reference phase in the comparison circuit is, however, for example pi/8, that is to say 22.5°. When the clock signal TS1 reaches this phase, the phase delay circuit emits the switching signal vSch1. The two phase delay circuits thus each produce a delayed switching signal.

Figure 2:
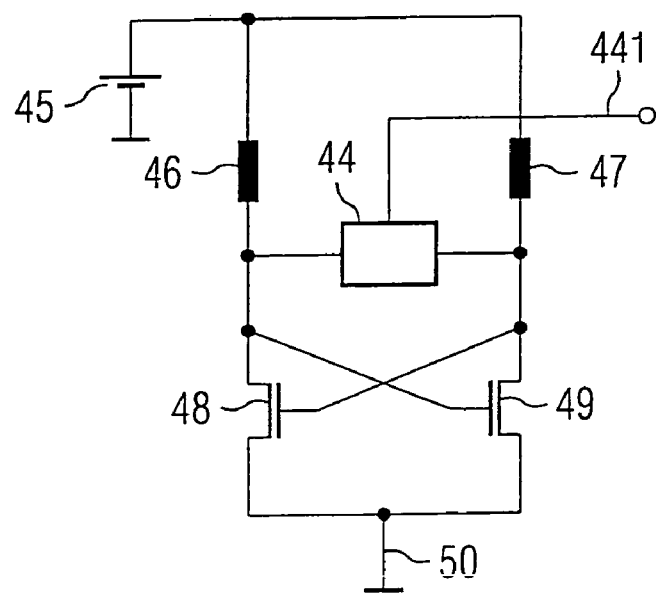
FIG. 2 is a schematic diagram illustrating a digitally tunable oscillator according to one embodiment of the invention.

FIG. 2 shows a schematic diagram illustrating one exemplary embodiment of a digitally tunable oscillator, in which the switching devices 5 and the capacitors 6 are contained in a digitally switchable capacitance array 44. The oscillator that is shown in FIG. 2 is a balanced LC oscillator. A voltage source 45 is in each case connected to one end of an inductance 46 and 47. The two other ends of the inductances 46 and 47 form not only the balanced switching output of the oscillator 4 but also one connection for the digitally controllable capacitance array 44. This also has a control input 441, which is connected to the switching output (which is not shown) of the phase delay circuit 9.

The switched capacitances within the capacitance array 44 as well as the inductances 46 and 47 determine the resonant frequency of the oscillator, and thus also the output frequency of the output 41. Furthermore, the oscillator contains a damping compensation amplifier, which is formed by two MOS transistors 48 and 49. The source connections of the MOS transistors 48 and 49 are connected to the reference ground potential 50. The drain connection of the field-effect transistor 48 is connected to the capacitance array 44 and to the inductance 46, while the drain connection of the field-effect transistor 49 is connected to the inductance 47. The gate connections of the MOS transistors 48 and 49 are connected, in each case cross-coupled, to the drain connection of the other transistor. This results in a negative impedance, which is used to counteract the damping of the oscillator 4.

The capacitance array 44 contains the capacitors illustrated in FIG. 1 as well as the switching device, which makes it possible to connect and disconnect the individual capacitances independently of one another as a function of the control signal of the input 441. The control signal is, in one example, a digital signal, which drives the individual switches for the capacitances to be switched. The capacitances which are used are in this case provided may be capacitors, varactor diodes, or any other circuit element or structure operable to provide a capacitance.

Figure 5:
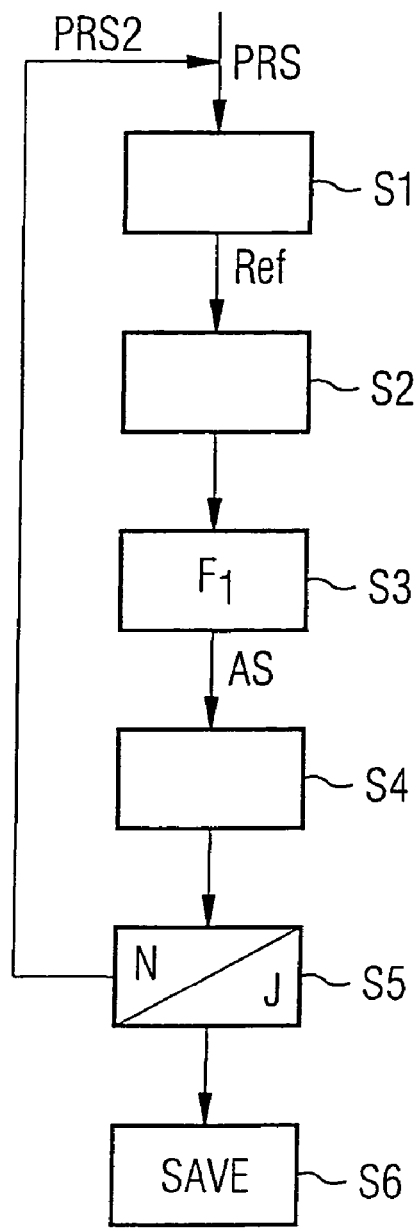
FIG. 5 is a flow chart illustrating a method of determining a proper phase delay according to an embodiment of the invention.

One example method for a trial series for determination of an optimum of sufficient phase delay is shown in FIG. 5. While the exemplary method is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with other systems and structures not illustrated.

In this example, one of the stored reference phases REF is selected at S1 by the program signal PRS at the input 95, and this is transmitted to the comparison circuit at S2. A first frequency F1 is then selected at the output of the oscillator at S3. At S4 of the method, a second frequency is selected at the output of the oscillator, by applying a switching signal AS to the input 94 of the phase delay circuit 9. The comparison circuit then compares the phase of the clock signal with the previously selected reference phase, and does not emit the switching signal until the two phases are the same.

S5 of the method is used to observe whether a sudden phase change has occurred at the output 1 of the oscillator control circuit after a frequency change. If this is the case, then the selected reference phase was not selected optimally, and the resultant phase delay was not sufficient. A second reference phase is then selected using a different program signal PRS2, and the further acts S1 to S5 are repeated. The method is repeated overall with different reference phases until the sudden phase change reaches a minimum, or disappears completely. The optimum reference phase determined in this way is identified at S6 as the optimum or at least sufficient phase, and is used from then on, and in particular during operation. The method can be modified in various ways. In particular, a frequency change can be carried out repeatedly using one selected reference phase in order to be certain that the optimum reference phase has been found.

In this method example, the storage device contains a number of preselected reference phases. In another embodiment, the comparison means directly comprises a plurality of selectable reference phases which can be driven directly by the program signal PRS. There is no need for a storage device in such an example.

A reference phase can, of course, also be defined as a function of the frequency change to be carried out. In the case of frequency changes with a major difference between the two frequencies, it is worthwhile subdividing these changes into a plurality of smaller changes. This reduces the magnitude of the step-function response. In order to determine the optimum reference phase, the clock signal must be investigated for a possible sudden phase change, or additional clock changes. This can be done manually by means of a measurement instrument such as an oscilloscope, for example during production. However, it is also possible to provide a circuit which automatically determines an optimum phase delay. This may be particularly worthwhile when a change in the reference phase is made necessary as a result of changes in external operating parameters such as the temperature or time of operation.

In another embodiment of the method, the program signal is used to select widely differing reference phases. The optimum reference phases are then stored in the storage device, and are selected by means of a second program signal at the program input. This method embodiment differs from the previous one by being more flexible, since defined phases are no longer used in the storage device. In this embodiment, the comparison means is configured to use different reference phases for the comparison and, in particular, continuous-value reference phases.

Figure 7:
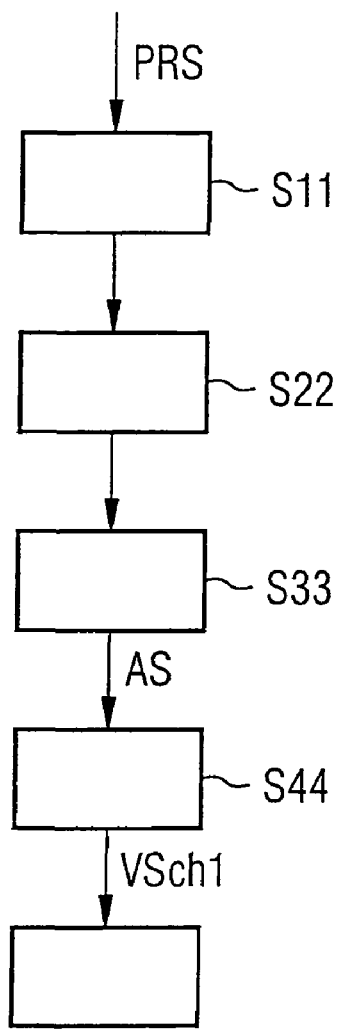
FIG. 7 is a flow chart illustrating another method according to another embodiment of the invention.

FIG. 7 shows one embodiment of the method. In this case, a fixed phase delay is selected at S11 via the signal PRS, and is transmitted to the delay circuit. The signal is then produced for a frequency change in the oscillator at S22. At S33, the edge detector detects a rising or, alternatively, a falling signal edge, and, when an event such as this occurs, then emits a signal AS to the delay circuit. The delay circuit delays the switching signal by the selected phase amount at S44. It then emits the switching signal vSch1 at the output, and the oscillator changes frequency. In this case as well, an optimum phase delay, for which any sudden phase change is minimized, can be found by additional observation of the clock signal during the frequency change and selection of different phase delays in the delay circuit.

The oscillator control circuit according to the invention can be used not only for transmitters and receiving devices for mobile radio, but also whenever clock signals must be produced which are highly sensitive to phase changes.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

The invention claimed is:

1. An oscillator circuit having closed-loop control for a frequency change, comprising:
    an oscillator tunable to discrete output frequency values, comprising an output for outputting an oscillator signal thereat;
    at least one tuning element selectively coupled to the oscillator via a switching device, and configured to selectively influence a tuning of a frequency of the oscillator signal;
    a threshold value circuit coupled to the oscillator and configured to produce a clock signal based on the oscillator signal, the clock signal comprising a phase; and
    a phase delay circuit comprising a first switching input, and a signal input configured to receive the clock signal of the threshold value circuit, and further comprising a switching output coupled to the switching device, and comprising a comparison circuit configured to compare the phase of the clock signal with a fixed reference phase value selected from a memory storing a plurality of predetermined fixed reference phase values, and further configured to emit a switching signal at the switching output in response to application of an activation signal to the first switching input and upon detecting a predetermined phase relationship between the clock signal and the fixed reference phase value.

2. The oscillator circuit of claim 1, wherein the phase delay circuit comprises an edge detector circuit configured to detect an edge of the clock signal applied to the signal input of the phase delay circuit, and configured to emit the switching signal after detection of the edge and a subsequent phase delay.

3. The oscillator circuit of claim 1, wherein the comparison circuit in the phase delay circuit is configured to emit the switching signal at the signal output of the phase delay circuit when the phase of the clock signal matches the fixed reference phase value.

4. The oscillator circuit of claim 1, wherein the phase delay circuit is configured to emit the switching signal in a first operating state, and a second operating state of the phase delay circuit forms a waiting state, and wherein the phase delay circuit is configured to be switched from the second operating state to the first operating state by the activation signal.

5. The oscillator circuit of claim 1, wherein the phase delay circuit comprises a second switching input configured to receive a program signal, and further comprising an adjustment means configured to adjust the reference phase or the phase delay of the circuit.

6. The oscillator circuit of claim 5, wherein the adjustment means comprises a programmable storage device configured to store at least two predetermined reference phases or at least two predetermined phase delays therein, and wherein the adjustment means is further configured to select one of the at least two reference phases or phase delays as a function of the program signal.

7. The oscillator circuit of claim 1, wherein the at least one tuning element of the oscillator comprises a charge store.

8. The oscillator circuit of claim 1, wherein the at least one tuning element comprises a varactor diode.

9. A method for carrying out a frequency change in an oscillator circuit comprising an oscillator tunable to discrete values, comprising:
    (a) supplying an activation signal for frequency switching of the oscillator to a switching input of the oscillator circuit;
    (b) using a program signal to select a fixed reference phase value from a plurality of predetermined fixed reference phase values;
    (c) comparing one phase of a clock signal derived from the oscillator signal with the selected fixed reference phase value;
    (d) producing a switching signal for frequency switching of the oscillator if the one phase matches or otherwise attains a predetermined phase relationship with the selected fixed reference phase value; and
    (e) switching the frequency of the oscillator signal using the switching signal.

10. The method of claim 9, further comprising detecting in (d) a rising or a falling edge of the clock signal, and, on detection, producing the switching signal with a predetermined phase delay with respect to the clock signal.

11. The method of claim 9, further comprising using the activation signal at the switching input of the oscillator circuit to select a tuning element to be switched by a switching device of the oscillator to thereby change the frequency.

12. An oscillator system, comprising:
    an oscillator circuit configured to generate an oscillator signal tunable in discrete frequency steps;
    a rectifier circuit configured to generate a clock signal based on the oscillator signal, the clock signal having a phase associated therewith;
    a memory configured to store a plurality of different fixed reference phase values;
    a phase delay circuit configured to compare the clock signal phase with a fixed reference phase value from the memory and generate a tuning control signal having a timing that is a function of the comparison,
    wherein a change in the frequency of the oscillator circuit is a function of the tuning control signal.

13. The oscillator system of claim 12, further comprising a switching circuit configured to selectively alter a capacitance associated with the oscillator circuit based on the tuning control signal.

14. The oscillator system of claim 13, further comprising a switchable variable capacitance array configured to selectively couple a capacitance to the oscillator circuit via the switching circuit, wherein an amount of the capacitance and a timing of the selective coupling is a function of the tuning control signal.

15. The oscillator system of claim 12, wherein the phase delay circuit comprises:
    a comparison circuit; and
    wherein the comparison circuit is configured to compare the clock signal phase with a selected one of the plurality of fixed reference phase values and generate the tuning control signal when the clock signal phase and the selected fixed reference phase value reach a predetermined phase relationship between one another.

* * * * *